(12) United States Patent
Miura et al.

(10) Patent No.: US 7,463,764 B2
(45) Date of Patent: Dec. 9, 2008

(54) PROBE AREA SETTING METHOD AND PROBE DEVICE

(75) Inventors: Youzou Miura, Nirasaki (JP); Tomokazu Ozawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 987 days.

(21) Appl. No.: 10/492,557

(22) PCT Filed: Feb. 18, 2003

(86) PCT No.: PCT/JP03/01707

§ 371 (c)(1),
(2), (4) Date: Apr. 14, 2004

(87) PCT Pub. No.: WO03/073493

PCT Pub. Date: Sep. 4, 2003

(65) Prior Publication Data

US 2004/0257101 A1 Dec. 23, 2004

(30) Foreign Application Priority Data

Feb. 26, 2002 (JP) .............................. 2002-050565

(51) Int. Cl.
*G06K 9/00* (2006.01)
*G01R 31/08* (2006.01)

(52) U.S. Cl. ........................ 382/145; 324/754; 324/758

(58) Field of Classification Search ................ 382/145; 324/754, 758, 724, 158.1, 756, 765; 378/34, 378/119, 84; 250/310
See application file for complete search history.

(56) References Cited

FOREIGN PATENT DOCUMENTS

| JP | 63-42137 | | 2/1988 |
|----|----------|---|--------|
| JP | 1-86531 | | 3/1989 |
| JP | 64-86531 | | 3/1989 |
| JP | 7-58175 | | 3/1995 |
| JP | 7058175 | * | 3/1995 |
| JP | 8-37213 | | 2/1996 |
| JP | 8037213 | * | 2/1996 |

* cited by examiner

*Primary Examiner*—Samir A Ahmed
*Assistant Examiner*—Mehdi Rashidian
(74) *Attorney, Agent, or Firm*—Oblon, Spivak, McClelland, Maier & Neustadt, P.C.

(57) ABSTRACT

With a wafer having an indefinite shape or a broken wafer, it is hard for an operator to assign the design address of an edge chip and set a probe area. In a probe-area setting method of this invention, a wafer W is placed on a main chuck (18) that is movable at least in the X- and Y-directions. The main chuck (18) is moved, thus moving wafer W in the X- and Y-directions. All edge chips formed on the wafer W are retrieved by means of an upper camera (21A), thereby setting a probe area. To retrieve the edge chips, an edge chip is selected as one with which the retrieval should be started. The edge chips are successively retrieved in the turning direction of the wafer, as the chip retrieval direction is changed to the X- or Y-direction.

9 Claims, 8 Drawing Sheets

PROBE AREA SETTING METHOD AND PROBE DEVICE

CROSS-REFERENCE TO RELATED APPLICATIONS

This application is based upon and claims the benefit of priority from the prior Japanese Patent Application No. 2002-50565, filed Feb. 26, 2002, the entire contents of which are incorporated herein by reference.

BACKGROUND OF THE INVENTION

The present invention relates to a method and system for setting a probe area (i.e., retrieval region) on a wafer-shaped substrate (hereinafter referred to as "wafer") and a probe apparatus comprising the system. More specifically, the invention relates to a method and system for setting a probe area, which can detect objects formed on the outer periphery of the wafer and automatically setting a probe area, and a probe apparatus that comprises the system.

A conventional probe apparatus comprises a loader chamber and a prober chamber. In the loader chamber, a wafer is transported and pre-aligned in the loader chamber. In the prober chamber, the chips on the wafer are inspected for their electrical properties. In the prober chamber, a stage (hereinafter referred to as "main chuck") holding the wafer moves in the X-, Y-, Z-, and θ-directions. A probe area is set in accordance with the positions of the edges of the wafer, which have been detected by an alignment mechanism. The probe area is that region of the wafer in which chips to be inspected are formed. The probe apparatus uses a probe card with a plurality of probes to inspect the chips formed in the probe area. After setting the probe area is set, the wafer is aligned with the probes of the probe card that is arranged above a main chuck. The stage holding the chips thereon is lifted until the electrodes of the chips electrically contact the probes. A tester uses a test head arranged between the probes and the tester, thereby to examine the wafer for electrical properties.

Hitherto, the operator sets the probe area by inputting the design position coordinates (address) of an outer peripheral object (hereinafter referred to as "edge chip") to an input device.

BRIEF SUMMARY OF THE INVENTION

In inspecting chips on a partially broken wafer, small-chip wafer or wafer having an indefinite shape, as well as chips on a wafer of an ordinary shape, it is very hard for an operator to input the design address of an edge chip to an input device. It takes him or her a long time to set the probe area. It is practically hard to set the probe area. Jpn. Pat. Appln. KOKAI Publication No. 7-58176 proposes a wafer inspection apparatus that can inspect broken wafers. However, the publication proposes no methods of setting a probe area.

An object of the present invention is to solve at least one of the problems described above. According to an aspect of the invention, a probe area can be reliably and easily set on a wafer of an indefinite shape, as well as a wafer having a regular shape, by retrieving the positions of edge chips.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

According to a first aspect of the invention, there is provided a method of setting a probe area on a wafer-shaped substrate placed on the stage of a probe apparatus which has an image-pickup apparatus for picking up an image of the surface of the stage. This method may be any one of the following types (1) to (10) or any combination of thereof.

(1) A method comprising:

(a) placing the substrate on the stage;

(b) selecting an object formed on the outermost periphery of the substrate, as an outer peripheral object to be inspected, and locating the object;

(c) moving at least one of the stage and the image-pickup apparatus in an X- or Y-direction, thereby retrieving and locating all outer peripheral objects formed on the outer periphery of the substrate, while changing the retrieving direction of the image-pickup apparatus to the X- or Y-direction; and (d) determining a probe area from the positions of all outer peripheral objects located in the step (c).

(2) A method as described in the paragraph (1), wherein (b) may be performed by moving the stage in the X- and Y-directions.

(3) A method as described in the paragraph (1), wherein (c) may further comprise: successively retrieving the objects adjacent to the outer peripheral object located in the step (b) in the rotational direction of the substrate, starting with the outer peripheral object located, thereby identifying all outer peripheral objects provided on the substrate. The identifying of the outer peripheral objects comprises the following items (c1) and (c2):

(c1) performing X-direction end-retrieval to retrieve each object formed on the outer periphery, at the opposite ends in the X-direction. The X-direction end retrieval is achieved by moving the retrieval position in a first Y-direction from the outer peripheral object already identified, such that:

(c1-1) If any object to inspect exists in the first Y-direction, the retrieval position is moved outward further in the X-direction; if any object exists in the position to which the retrieval position has been moved, the retrieval position is moved until no objects exist at the new retrieval position; if no objects exist at the new retrieval position, the retrieval position is moved back to the immediately preceding object; the immediately preceding object is identified as an outer peripheral object, and then the retrieval position is moved again in the first Y-direction; and (c1-2) if nay object exists in the first Y-direction, the retrieval position is moved inward in the X-direction; if an object exists in the position to which the retrieval position has been moved, this object is identified as an outer peripheral object; the retrieval position is then moved again in the first Y-direction; if no object exists in the position to which the retrieval position has been moved, the Y-direction ends are retrieved; and (c2) performing Y-direction end retrieval to retrieve each object formed on the outer periphery, at the opposite ends in the Y-direction. The Y-direction end retrieval is accomplished by moving the retrieval position in a first X-direction from the outer peripheral object already identified as objects, to retrieve other objects to inspect, such that:

(c2-1) if any object exists in the first X-direction, the retrieval position is further moved outward in the Y-direction; if no objects exist in the position to which the retrieval position has been move, the retrieval position is moved back to the immediately preceding object, and this object is identified as an outer peripheral object: the retrieval position is then moved again in the first X-direction; and (c2-2) if no objects exist in the first X-direction, the retrieval position is moved inward in the Y-direction and the X-direction ends are retrieved.

(4) A method as defined in the paragraph (1), wherein (c) may further comprise first retrieving the outer peripheral object located in (b) and then retrieving the objects adjacent to the outer peripheral object, one after another in the circumferential direction of the substrate, thereby identifying all the outer peripheral objects formed on the substrate, the identifying of the outer peripheral objects comprising the following:

(c3) performing X-direction end retrieval to retrieve the objects formed on the outer periphery, at the opposite ends in the X-direction, and the X-direction end retrieval is accomplished by moving the retrieval position in a first Y-direction from the outer peripheral object already located, by a distance for a plurality of objects at a time, such that:

(c3-1) if any object to inspect exists in the first Y-direction, the retrieval position is repeatedly moved outward in the X-direction, each time by a distance for one object; if any object exists in the position to which the retrieval position has been moved, the retrieval position is moved outward in the X-direction until no object exists at the new retrieval position; if no objects exist in the position to which the retrieval position has been moved, the retrieval position is moved back to the immediately preceding object, this object is identified as an outer peripheral object, and the retrieval position is then moved again in the first Y-direction;

(c3-2) if no objects exist in the first Y-direction, the retrieval position is repeatedly moved inward in the X-direction, each time by a distance for one object; if any object exists at any retrieval position in the X-direction, this object is identified as an outer peripheral object. The retrieval position is moved again in the first Y-direction; if no objects exist at any retrieval position in the X-direction, the retrieval position is moved back the object next to the immediately preceding outer peripheral object, and the retrieval position is then repeatedly moved inward in the X-direction, each time by a distance for one object;

(c4) performing Y-direction end retrieval to retrieve the objects formed on the outer periphery, at the opposite ends in the Y-direction. The Y-direction end retrieval is achieved by moving the retrieval position in a first X-direction from the outer peripheral object already identified, by a distance for a plurality of objects of inspection at a time, such that:

(c4-1) if any object exists in the first X-direction, the retrieval position is repeatedly moved outward in the Y-direction, each time by a distance for one object; if any object exists in the position to which the retrieval position has been moved, the ends in the X-direction ends are retrieved; if no objects exist in the position to which the retrieval position has been moved, the retrieval position is moved back to the immediately preceding object; this object is identified as an outer peripheral object, and then the retrieval position is moved again in the first X-direction; and (c4-2) if no objects exist in the first X-direction, the retrieval position is repeatedly moved inward in the Y-direction, each time a distance for one object, and the ends in the X-direction are thereby retrieved.

(5) A method as defined in the paragraph (1), wherein (c) may comprise retrieving first the outer peripheral object in (b) and then retrieving the objects adjacent to this outer peripheral object, one after another, in the circumferential direction of the substrate. Thus, all outer peripheral objects formed on the substrate are identified.

(6) A method as defined in the paragraph (1), wherein the wafer-shaped substrate, on which the probe area is set, is a broken substrate, a substrate of an indefinite shape, or a substrate having small objects, on which outer peripheral objects can hardly be located in advance.

(7) A method as defined in the paragraph (1), wherein a limit is set in (c) to the distance for which the retrieval position is moved in the X-direction to locate a plurality of objects formed on the outer periphery.

(8) A method as defined in the paragraph (7), wherein the direction of moving the retrieval position over the substrate is changed from the X-direction to the Y-direction when the limit is reached or exceeded.

(9) A method as defined in the paragraph (4), wherein objects lying on a line connecting two adjacent outer peripheral objects located in succession are identified as outer peripheral objects to inspect.

(10) A method as defined in the paragraph (1), wherein objects having element patterns different from that of the aforesaid object are not subjected to retrieval.

According to a second aspect of the invention, there is provided a system that retrieves a plurality of objects formed on a wafer-type substrate and sets a probe area on the substrate. The system may be any one of the following types (11) to (15) or any combination of the types.

(11) A system comprising: a stage; a second storage means for storing the respective element patterns of the objects to inspect; image-pickup means for picking up images of the element patterns of the objects placed on the stage; means for selecting a first outer peripheral object; and a control-processor unit which retrieves objects formed on the substrate, one after another in the circumferential direction of the substrate, starting with the outer peripheral object first selected, which determines positions of objects formed on the outermost periphery of the substrate. The control-processor unit compares the images acquired by the image-pickup means, with the element patterns stored in the second storage means, to determine whether the images are identical to the element patterns.

(12) A system as defined in the paragraph (11), wherein the control-processor unit first retrieves any object identified as an outer peripheral object, then retrieves the objects adjacent to the object identified as an outer peripheral object, one after another, and finally moves a retrieval position in the circumferential direction of the substrate, thereby to set a probe area.

(13) A system as defined in the paragraph (11), wherein the control-processor unit repeatedly moves the retrieval position in the X- and Y-directions, each time by a distance for a plurality of objects.

(14) A system as defined in the paragraph (11), wherein the control-processor unit identifies objects on a line connecting two adjacent outer peripheral objects located in succession, as outer peripheral objects to inspect.

(15) A system as defined in the paragraph (11), wherein the control-processor unit causes the retrieval position to move outward in a given direction, from the center position of the substrate, starts retrieving the objects, and uses an outer peripheral object located in this direction as a starting point for the subsequent retrieval.

According to a third aspect of the invention, there is provided a probe apparatus comprising a system which retrieves a plurality of objects formed on a wafer-type substrate and sets a probe area on the substrate to inspect the objects. The probe apparatus comprises a stage, a second storage means which stores the respective element patterns of the objects, image-pickup means for picking up images of the element patterns of the objects of inspection placed on the stage, and a control-processor unit which successively retrieve the objects formed on the substrate in the turning direction of the substrate and locates an object of inspection on the outermost periphery of the substrate. The control-processor unit compares the images picked up by the image-pickup means with the element patterns stored in the second storage means and determines whether the images picked up by the image-pickup means are identical to the element patterns.

BRIEF DESCRIPTION OF THE SEVERAL VIEWS OF THE DRAWING

The accompanying drawings, which are incorporated in and constitute a part of the specification, illustrate preferred embodiments of the invention. They serve to explain the principles of the invention, together with the general description given above and the detailed description of the preferred embodiments given below.

DETAILED DESCRIPTION OF THE INVENTION

Figure 1A:
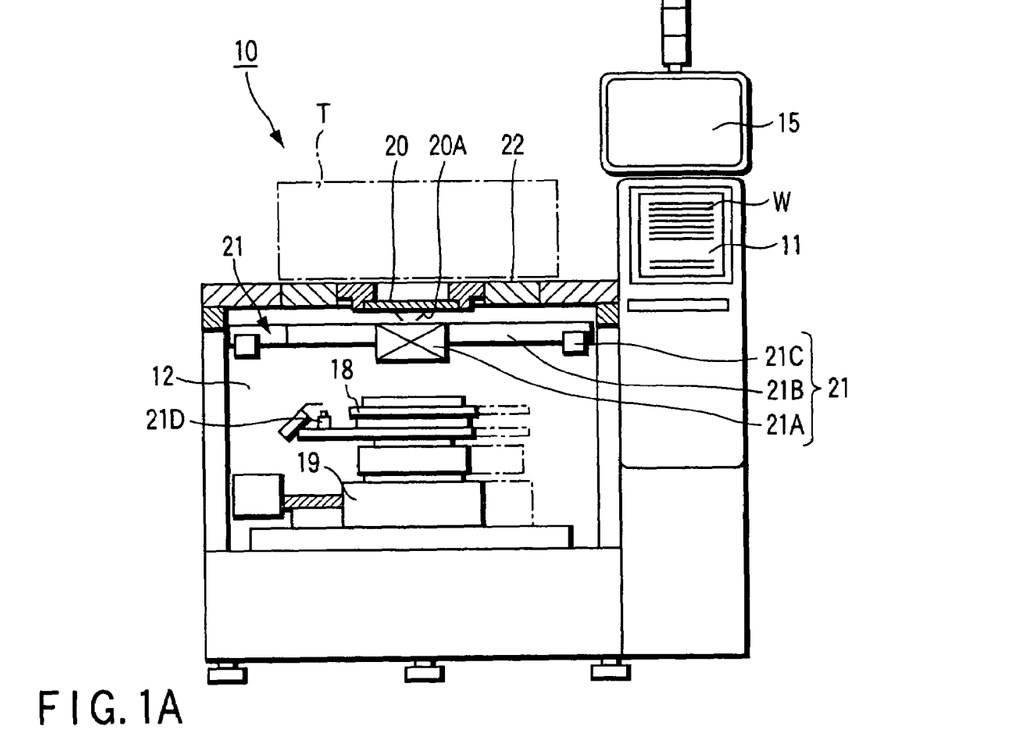
FIGS. 1A and 1B are a cutaway front view and a plan view, showing an embodiment of a probe apparatus to which a probe area setting method of the invention is applied.
Figure 1B:
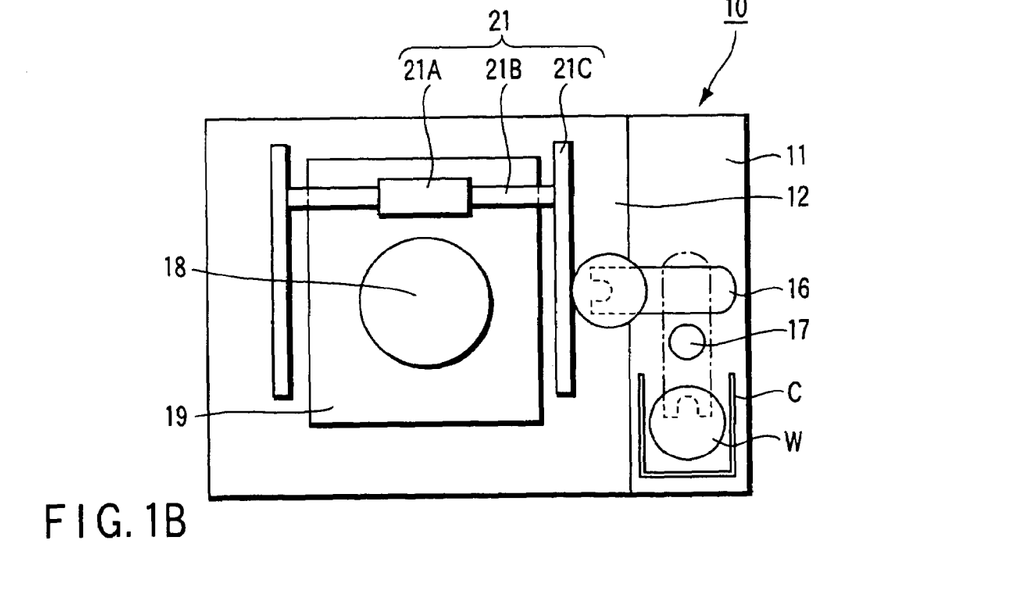
Figure 2A:
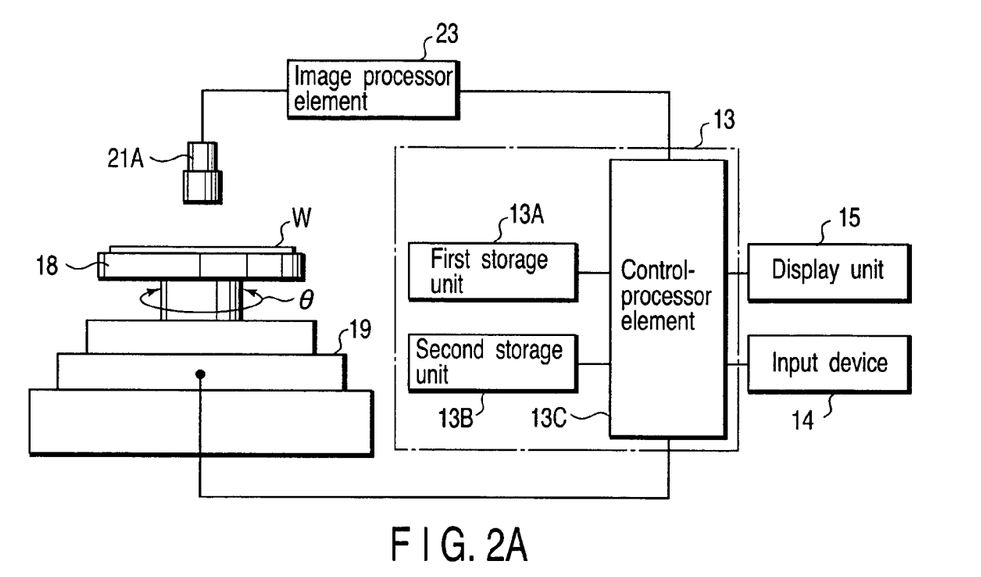
FIGS. 2A, 2B and 2C show the principal components of the probe apparatus of FIG. 1, FIG. 2A being a block diagram, FIG. 2B depicting the screen of the display, and FIG. 2C illustrating the step-size input menu.

The present invention will be described with reference to the accompanying drawings. As FIGS. 1A and 1B show, a probe apparatus 10 according to a first embodiment has a loader chamber 11 and a prober chamber 12. In the loader chamber 11, a wafer W is transported, pre-aligned. In the prober chamber 12, the wafer W transported from the loader chamber 11 is inspected for electrical properties. As FIG. 2A depicts, the probe apparatus 10 comprise a control device 13, an input device 14, and a display unit 15. The control device 13 controls the devices provided in the chambers 11 and 12. The probe apparatus 10 may be similar in basic structure to the conventional ones. The input device 14 may be, for example, a keyboard or joystick. The display unit 15 can display images picked up by an image-pickup means. It can also display a menu for setting various conditions under which to inspect the chips provided on the wafer W.

As FIG. 1B illustrates, the loader chamber 11 has a wafer transportation mechanism (hereinafter referred to as "tweezers") 16 and a sub-chuck 17. The tweezers 16 can transport a wafer W between, for example, a cassette C and the prober chamber 12. While the tweezers 16 is transporting the wafer W, the sub-chuck 17 can pre-align the wafer W, using the notch made in the wafer W or the orientation flat of the wafer W as the reference position.

As FIGS. 1A and 1B show, the prober chamber 12 may contain a main chuck 18, a drive mechanism 19, and an alignment mechanism 21. The main chuck 18 can hole the wafer W. The drive mechanism 19 is, for example, an XY-table that moves the main chuck 18 in the X-, Y-, and Z-directions. The alignment mechanism 21 causes the drive mechanism 19 to move the main chuck 18 in the X- and Y-directions, to align the wafer W with the probe 20A of a probe card 20 that is positioned above the wafer W. The probe card 20 may be fixed to the head plate 22 that is the top wall of the prober chamber 12. A test head T is provided, which can be connected to and disconnected from the probe card 20.

As FIGS. 1A and 1B show, the alignment mechanism 21 may comprise an upper camera 21A, an alignment bridge 21B, a pair of guide rails 21C, and a lower camera 21D. The upper camera 21A picks up an image of the wafer W. The alignment bridge 21B supports the upper camera 21A. The guide rails 21C support the bridge 21B, allowing the same to move in the Y-direction. The lower camera 21D is attached to the main chuck 18 and picks up an image of the probe card 20. The upper camera 21A can advance along the guide rails 21C to the center of the probe (probe center) to pick up an image of the wafer W. The lower camera 21D picks up an image of the probe 20A. The wafer W and the probe 20A are aligned in accordance with the images picked up by the cameras 21A and 21D. How the wafer W is aligned can be displayed on the display unit 15.

The probe apparatus according to the first embodiment of the invention comprises a system for retrieving chips formed on the wafer W and setting a probe area on the wafer W. The system may comprise a stage 18, a second storage unit 13B, the upper camera 21A, means for selecting the first edge chip, and a control-processor unit 13C. The second storage unit 13B stores the respective element patterns designed for the chips. The control-processor unit 13C constitutes the control device 13.

The control-processor unit 13C compares the images of the chips successively picked up by the upper camera 21A with the element patterns stored in the second storage means, determining whether they are identical to the patterns. The chips formed on the wafer W are successively retrieved in the turning direction of the wafer W. For each chip it is determined for each chip whether the image picked up by the camera 21A is identical to any pattern stored in the second storage means. The edge chips formed on the outermost periphery of the wafer W are thereby located. Any chip whose image is found to differ from the element patterns can be excluded the group of objects to be retrieved as edge chips.

The control device 13 of the first embodiment stores software that automatically sets a probe area. More precisely, the control device 13 has first and second storage units 13A and 13B and the control-processor unit 13C, as illustrated in FIG.

2A. The first storage unit 13A stores a probe-area setting program and some control programs. These programs are read into the second storage unit 13B. The control-processor unit 13C drives the probe apparatus 10 in accordance with these programs.

To set a probe area, the upper camera 21A picks up the images of the element patterns of the chips. To pick up the image of each chip, the upper camera 21A must be aligned with the chip. The camera 21A may be moved until it is aligned with the target chip. Alternatively, the drive mechanism 19 may move the main chuck holding the wafer W, to align the target chip to the upper camera 21A. In the first embodiment, the control device 13 controls the drive mechanism 19, which moves the main chuck in the X- and Y-directions to achieve the alignment.

Figure 2B:
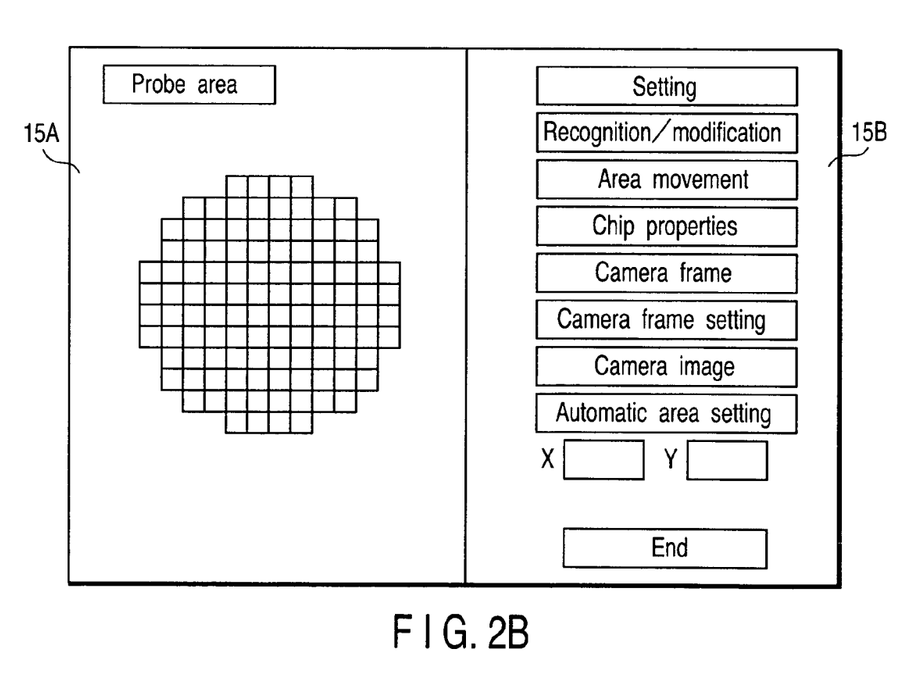

The main chuck holding the wafer W can be moved in the X- and Y-directions, in accordance with the probe-area setting program. This enables the upper camera 21A to automatically photograph and retrieve the edge chips formed on the outer periphery of the wafer W. The probe apparatus according to the embodiment of the invention may store a program that sets a probe area correctly, whichever shape the wafer W has. This program causes the display unit 15 to display a probe-area setting menu on the display screen 15A, as shown in FIG. 2B. The operator may use this menu to set various conditions for setting a probe area.

Figure 2C:
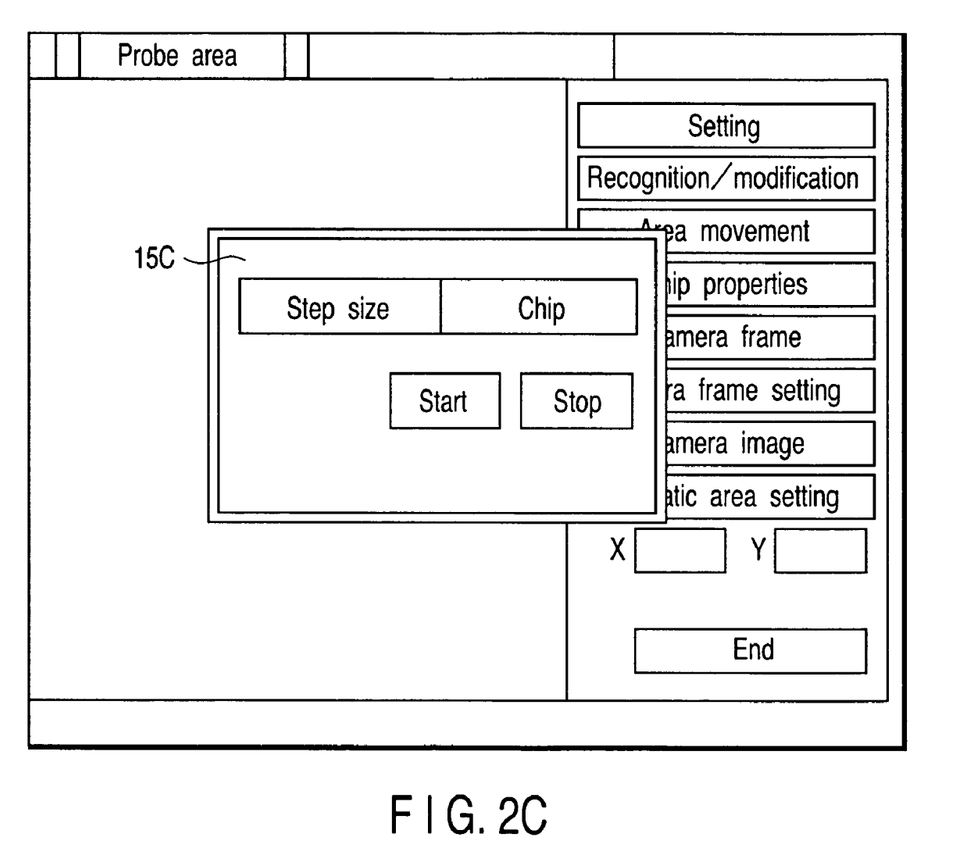

As FIG. 2B shows, the display unit 15 can display a probe-area setting menu 15B on, for example, the right half of the screen 15A and the image of a wafer W, or a wafer map, on the left half of the screen 15A. When the operator touches, for example, "AUTOMATIC AREA SETTING" in the menu 15B while the display unit 15 is displaying only the probe-area setting menu 15B on the screen 15A, a step-size inputting menu 15C is displayed on the screen 15A as shown in FIG. 2C. When "AUTOMATIC AREA SETTING" is touched, the image of the wafer W, photographed by the camera, or the wafer map can be displayed, if it is displayed on the left half of the screen 15A. The step size is the distance by which the retrieval position should be moved, at one time, on the wafer W. It is a parameter used to move the retrieval position from an edge chip recognized for a distance corresponding to a identified number of chips, to recognize the next edge chip. The step size may range from 1 to 99, for example. If the step size "1" is input, the retrieval position will be moved stepwise in the X- or Y-direction, each time for one-chip distance. If "2" is input, the position will be moved stepwise, each time for a two-chip distance. "START" and "STOP" are displayed in the step-size input menu 15C, in addition to the step size. The operator may touch "START" after inputting a desired step size. Then, the automatic setting of a probe area will start. If he or she touches "STOP", the automatic setting of a probe area will be stopped. To set a probe area manually, without using the automatic area setting, the operator can input an address in the probe-area setting menu 15B (FIG. 2B).

Once a probe area has been automatically set, magnified images (not shown) of chips can be displayed. The first edge chip (e.g., edge chip on the top side of the wafer W) at which the setting of the probe area starts can be selected as a start chip by operating, for example, the joystick. More precisely, the operator may manipulate the joystick, bringing a part of the chip into alignment with the cross displayed at the center of the screen 15A. Any part of the chip can be aligned with the cross to assign the chip as start chip. For example, a corner of the chip may be aligned with the cross. If "DETERMINED" on the probe-area setting menu 15B is touched after the chip is assigned as start chip, the automatic setting of the probe area is started. When the automatic setting is started, the main chuck 18 is gradually moved in the X- or Y-direction, using the first edge chip regarded as a starting point. The edge chips of the wafer W are therefore sequentially retrieved in the direction the wafer is rotated. This minimizes the length of the retrieval route, setting the probe area efficiently. The wafer can be rotated either clockwise or counterclockwise. Nonetheless, it is rotated counterclockwise in the present embodiment. The probe area can be set any time after all edge chips are retrieved.

Alternatively, the start chip may be automatically identified without using the joystick in the aforesaid manner. That is, the chips may be automatically retrieved by moving the retrieval position from the center part of the main chuck 18 in an outward direction, for example, upward. In this case, the chip regarded as an edge chip can be used start chip. Note that the outward direction is one in which the retrieval position moves from the center of the wafer W to the outer periphery, and that the inward direction is one in which the retrieval position moves from the outer peripheral portion of the wafer W to the center.

Figure 3A:
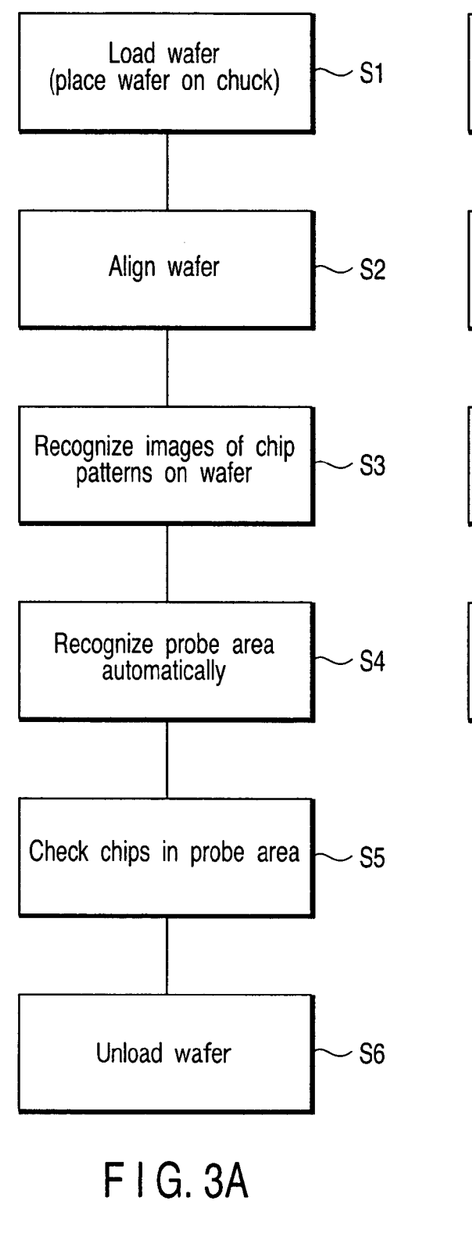
FIG. 3A is a flowchart representing operation performed in a prober chamber of the probe apparatus shown in FIG. 1.

How the probe apparatus 10 operates to perform the probe-area setting method of the present invention will be specifically described, with reference to the accompanying drawings. When the apparatus 10 is started, the control device 13 begins to control the devices provided in the loader chamber 11 and prober chamber 12. To be more specific, the tweezers 16 provided in the loader chamber 11 takes one of the wafers W from the cassette C and places it on the sub-chuck 17. After the wafer W is pre-aligned on the sub-chuck 17, the tweezers 16 transports the wafer W to the prober chamber 12. In the prober chamber 12, the wafer W is placed on the main chuck 18 (S1), as shown in FIG. 3A. The main chuck 18 and alignment mechanism 21 cooperate, aligning the wafer W (S2). The upper camera 21A picks up images of the chips provided on the wafer W to recognize an element pattern (hereinafter called "reference element pattern") that will be used to retrieve the chips. An image processor element 23 processes the images. The control-processor unit 13C recognizes the images the images processed (S3). The images recognized constitute the reference element pattern. The pattern thus recognized is stored in the second storage unit 13B. Note that the camera 21A may photographs one representative chip or two or more chips. If the element pattern of the chips is known, it may be input to the second storage unit before the inspection is started. Subsequently, the probe area setting program is started. The upper camera 21A automatically recognizes the edge chips on the outer periphery of the wafer W, one after another, setting a probe area (S4). Then, the chips in the probe area thus set are checked one by one (S5). When all chips in the probe area are checked, the tweezers 16 unloads the wafer W from the main chuck 18 (S6). The operation returns it to the cassette C.

Figure 3B:
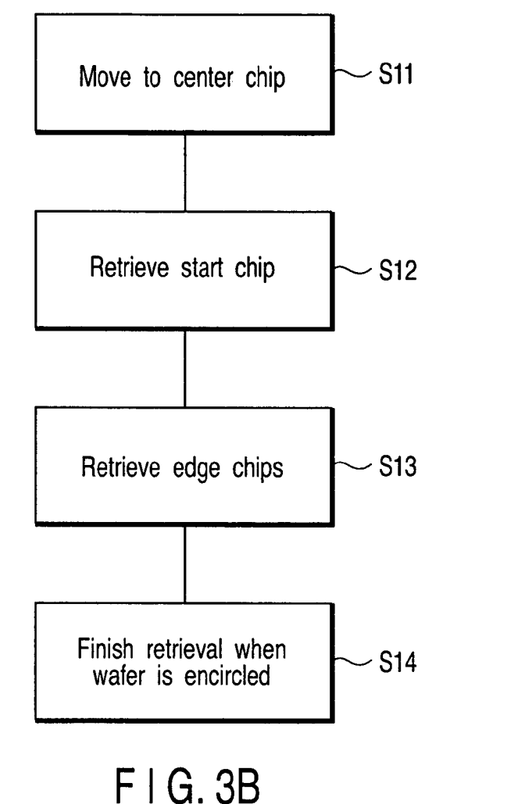
FIG. 3B is a flowchart outlining the probe-area setting method according to the invention.

The sequence of automatically retrieving the start chip in the process (S3) of automatically recognizing the probe area, as will be described. At first, a retrieval-starting position is set at the chip (center chip) formed in the center part of the wafer W (Sl1), as illustrated in FIG. 3B. Then, the camera photographs the chips, one after another, in the outward direction, e.g., in the Y-direction, starting with the center chip. The images of the chips are compared with the reference element pattern stored in the second storage unit. The comparison is repeated, thereby finding an edge chips on the end that is upper as viewed in the Y-direction (S12). The chip found is identified as start chip. The element patterns of the respective chips that the upper camera 21A has picked up may be sent directly to the control-processor unit 13C and compared with the reference element pattern. Alternatively, they may be stored in a storage unit incorporated in the control device 13.

Figure 4A:
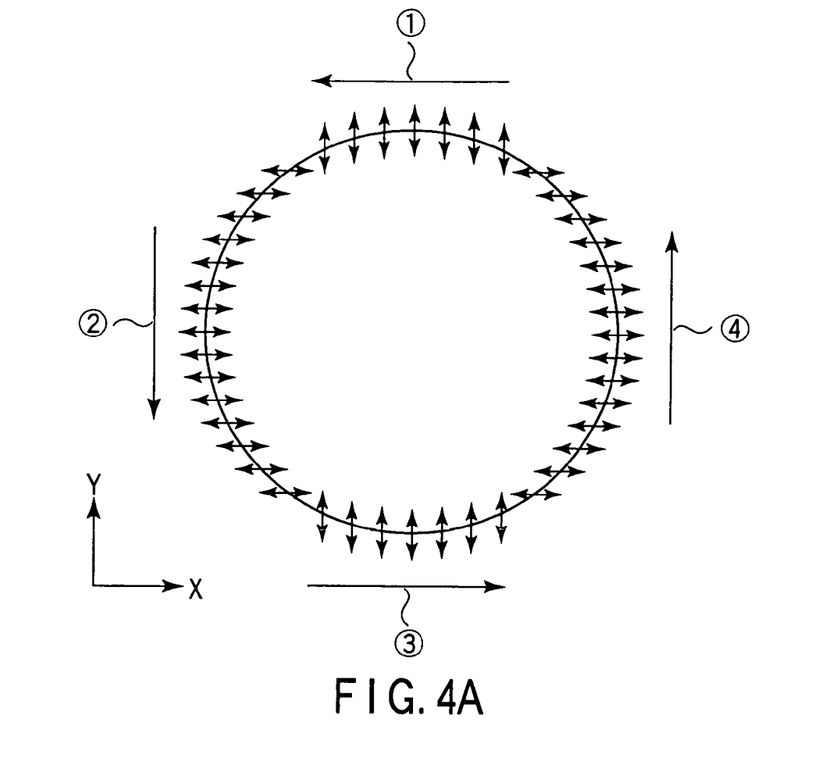
FIGS. 4A and 4B are diagrams illustrating how edge chips are retrieved by a probe-area setting method according to this invention.
Figure 4B:
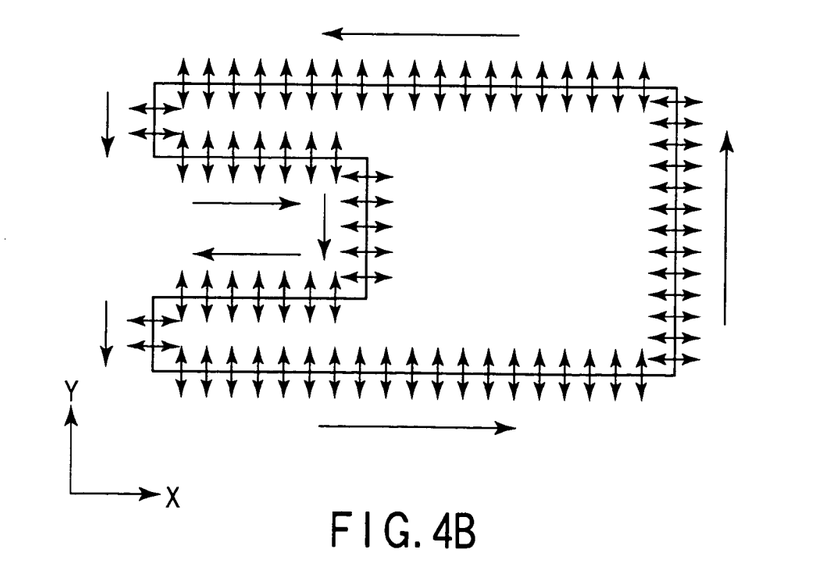
Figure 5:
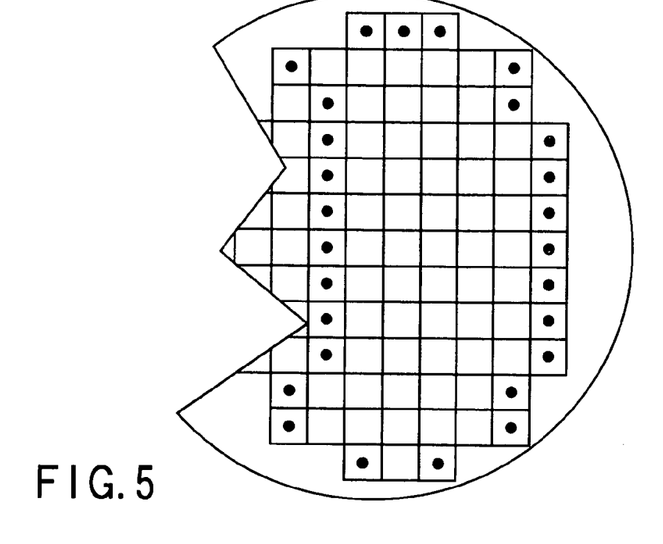
FIG. 5 are diagrams that illustrates the results of retrieving the edge chips of a broken wafer by using the probe-area setting method of the invention.

Thereafter, the edge chips are identified, starting with the start chip as shown in FIG. 4A, while the wafer W is being rotated. The wafer W may be rotated either clockwise or counterclockwise. In the present embodiment, it is rotated counterclockwise to retrieve edge chips, as illustrated in FIGS. 4A and 4B. The edge chips are successively retrieved as indicated by arrows ①, ②, ③, and ④(S13). Arrow ① indicates the direction of retrieving the edge chips formed on the top side (as viewed in the Y-direction), achieving "top-side retrieval". Arrow ② indicates the direction of retrieving the edge chips formed on the left side (as viewed in the X-direction), carrying out "left-hand retrieval". Arrow ③ indicates the direction of retrieving the edge chips formed on the bottom side (as viewed in the Y-direction), effecting "bottom-side retrieval". Arrow ④ indicates the direction of retrieving the edge chips formed on the right-hand side (as viewed in the X-direction), performing "right-hand retrieval". The retrieval position is moved to and from a point outside the edge chips as double-headed arrows show in FIGS. 4A and 4B to determine that no chips exist outside the edge chips. Thus, the edge chips are identified. When the wafer W is rotated through 360°, all edge chips are retrieved, whereupon the probe area is set (S14). Even edge chips on a wafer W of an indefinite shaped can be retrieved by rotating the wafer W counterclockwise as indicated by the arrows in FIG. 4B. Thus, in the embodiment of the invention, all edge chips (black spots in FIG. 5) can be reliably retrieved to set the probe area, even on a broken wafer W, wafer W of an indefinite shape, small-chip wafer W, or any other kind of a wafer, on which edge chips cannot be easily located in advance as shown in FIG. 5. Since the chips are retrieved by comparing their element patterns with the reference element pattern, moreover, broken edge chips may be excluded from the probe area.

How the other edge chips are retrieved counterclockwise, starting with the start chip, to set the probe area will be described with reference to FIGS. 6 to 9. In the first embodiment, the step size is set to "1".

First, the main chuck 18 is moved stepwise to the right in the X-direction. The top-side retrieval is performed, retrieving the edge chips on the upper end with respect to the Y-direction. This retrieval proceeds to the left in the X-direction. The top-side retrieval will be described with reference to FIGS. 6A and 6B.

Figure 6A:
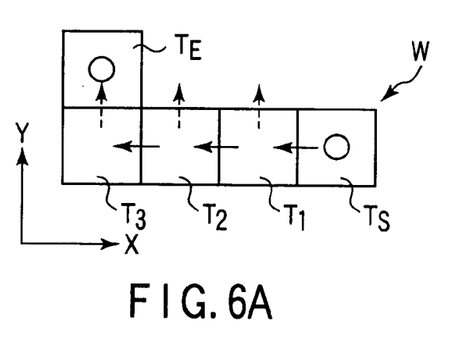
FIGS. 6A and 6B are diagrams that explains how top-side retrieval is performed on the wafer, by using the probe-area setting method of the invention.

In the top-side retrieval shown in FIG. 6A, the edge chips are retrieved in a first X-direction, starting with a start chip $T_S$, as indicated by full-line arrows. The retrieval position is moved stepwise to the left in the X-direction for one-chip distance. The first chip $T_1$ is thereby detected. It is determined whether the chip $T_1$ has the same pattern as the reference element pattern stored in the second storage unit. If the chip $T_1$ has the same pattern, it is determined that a chip does exist. Then, the retrieval position is moved outward (upward) in the Y-direction from the chip $T_1$ for one-chip distance, as indicated by a broken-line arrow, to find a chip. In this case, no chips are found. The retrieval position is returned to the chip $T_1$. The first chip $T_1$ is thus identified as an edge chip formed on the upper end with respect to the Y-direction.

Similarly, the retrieval position is moved stepwise to the left in the X-direction for one-chip distance, as indicated by full-line arrow. The retrieval position is then moved upward in the Y-direction, as indicated by broken-line arrow. It is then is returned to the original position. In this case, the second chip $T_2$ is identified an edge chip formed on the upper end with respect to the Y-direction.

Further, the retrieval position is moved to the third chip $T_3$. The position is then moved outward (upward) in the Y-direction for one-chip distance to find a chip. A chip lies above the third chip $T_3$ in the Y-direction. Hence, the retrieval is switched to X-direction end retrieval (right-hand retrieval for this case). Thereafter, the right-hand retrieval (mentioned later) is carried out, retrieving the edge chips on the right-hand end with respect to the X-direction, one to the next upper one in the Y-direction.

Figure 6B:
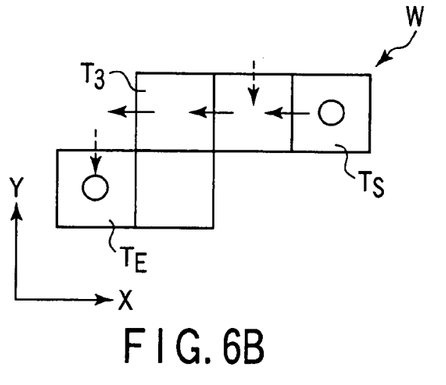

During the top-side retrieval, a chip may be found inside (or below) the third edge chip $T_3$, counted from the start chip $T_S$, as shown in FIG. 6B in contrast with FIG. 6A. If this is the case, the retrieval is switched to the left-hand retrieval. When the retrieval position is moved to the left in the X-direction from the chip $T_3$ as shown in FIG. 6B, it is determined that there are no chips. Thereupon, the retrieval position is moved inward (downward) in the Y-direction. Thereafter, the left-hand retrieval (mentioned later) is performed, retrieving the edge chips on the left-hand end with respect to the X-direction, downward in the Y-direction.

When the top-side retrieval shown in FIG. 6B is completed, the main chuck 18 is moved upward in the Y-direction. In other words, the left-hand retrieval is started, and the retrieval position is moved over the wafer W, inward (downward) in the Y-direction in a stepwise manner. The left-hand retrieval will be described with reference to FIGS. 7A and 7B.

Figure 7A:
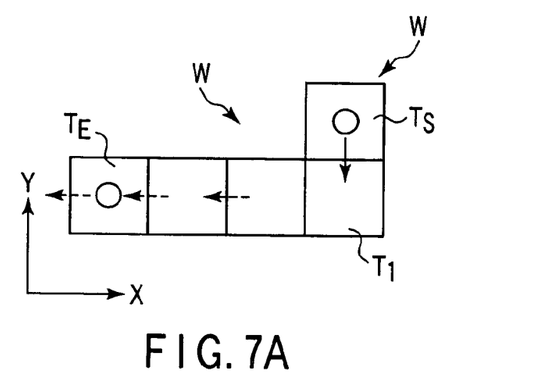
FIGS. 7A and 7B are diagrams that explain how left-hand retrieval is performed on the wafer by using the probe-area setting method of the invention.

In the left-hand retrieval shown in FIG. 7A, the retrieval position is moved downward in the Y-direction from a start chip $T_S$, in a stepwise manner for one-chip distance, as indicated by full-line arrow. The first chip $T_1$ is thereby detected. It is determined whether the chip $T_1$ has the same pattern as the reference element pattern. If the chip $T_1$ has the same pattern, it is determined there is a chip. Then, the retrieval direction is changed from the Y-direction to the X-direction. The chips are retrieved outward in the X-direction, starting with the first chip $T_1$, as indicated by broken-line arrow. More precisely, the chips are retrieved to the left, one after another. The retrieval position is continuously moved outward in the X-direction until no chips are found. In the case shown in FIG. 7A, no chips are found as the retrieval position is moved from the fourth chip, to the left in the X-direction. The retrieval position is returned to the last chip, or the fourth chip. The fourth chip is identified as edge chip $T_E$. The retrieval position is the moved downward again in the Y-direction, from the edge chip $T_E$ in a stepwise manner. The left-hand retrieval is continued in like manner.

With the first embodiment it is possible to set a retrieval limit, or a distance for which the retrieval position can be moved stepwise in the X-direction to retrieve the edge chips. In the case shown in FIG. 7A, too, it is determined whether the stepwise motion of the retrieval position falls within the retrieval limit while the retrieval position is being moved stepwise to the left in the X-direction from the chip $T_1$, after it has been moved downward in the Y-direction. If any chip remains after the retrieval limit is reached by the retrieval position moving in the X-direction, the retrieval can be switched to Y-direction retrieval or the top-side retrieval. The retrieval limit set can modify the retrieval direction to retrieve the chips along the outer circumference of the wafer W. This prevents useless retrieval, ultimately shortening the time for setting the probe area.

Figure 7B:
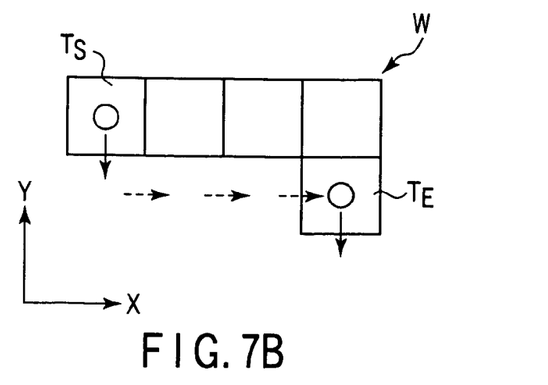

In the left-hand retrieval shown in FIG. 7B, no chips are detected even if the retrieval position is moved downward in the Y-direction from the start chip $T_S$, stepwise for one-chip distance as indicated by full-line arrow. Thus, it is determined that an edge chip exists inside (or on the right hand of) that position. The retrieval direction is changed from the Y-direction to the X-direction. Then the retrieval position is moved stepwise to the right in the X-direction to find chips, until the retrieval limit is reached. If any chip is found within the retrieval limit, it is identified as edge chip $T_E$. Thus, the edge chip $T_E$ is retrieved. The retrieval position is then moved downward in the Y-direction, stepwise for one-chip distance. The left-hand retrieval is repeated.

If no chips are found before the retrieval limit is reached, the left-hand retrieval is switched to the bottom-side retrieval. Thus, the retrieval position can be moved stepwise to the right in the X-direction, to retrieve the edge chip.

When the left-hand retrieval shown in FIG. 7B is finished, the main chuck 18 is moved to the left in the X-direction. That is, the retrieval position is moved over the wafer W, to right in the X-direction. Thus, the bottom-side retrieval is started to retrieve the edge chips formed on the lower end with respect to the Y-direction. The bottom-side retrieval will be described with reference to FIGS. 8A and 8B.

Figure 8A:
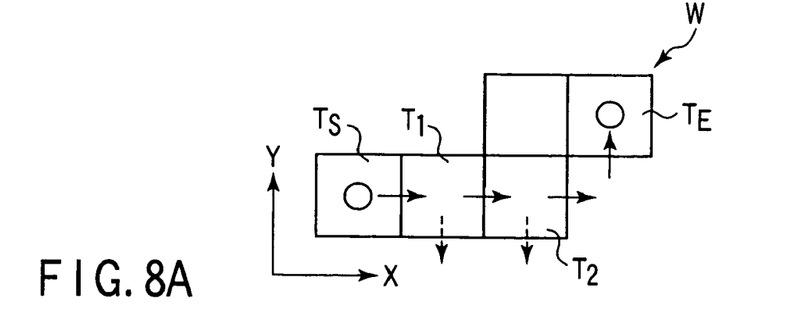
FIGS. 8A and 8B are diagrams that explains how bottom-side retrieval is performed on the wafer by using the probe-area setting method of the invention.

In the bottom-side retrieval shown in FIG. 8A, the retrieval position is moved stepwise to the right in the X-direction, from the start chip $T_S$ for one-chip distance, as indicated by full-line arrow. The first chip $T_1$ is thereby detected. Whether or not the chip $T_1$ has the same pattern as the reference element pattern is determined. If the element pattern has the same pattern, it is determined that there is a chip. The retrieval position is then moved downward in the Y-direction from the chip $T_1$ for one-chip distance to find chips, as indicated by broken-line arrow. In this case, it is determined that there are no chips. Hence, the retrieval position is returned to the chip $T_1$. The chip $T_1$ is identified as an edge chip formed on the lower end with respect to the Y-direction. Then, the retrieval position is moved stepwise to the right in the X-direction for one-chip distance, as indicated by full-line arrow, to retrieve chips on the lower side with respect to the Y-direction, as indicated by broken-line arrow. If no chips are found, the retrieval position is returned to the original position, and the second chip $T_2$ is identified an edge chip on the lower end with respect to the Y-direction. The retrieval position may be moved to the right in the X-direction from the second chip $T_2$. In this case, it is determined that there are no chips. The retrieval position is moved inward in the Y-direction, or upward for this case. The bottom-side retrieval is switched to the right-hand retrieval.

Figure 8B:
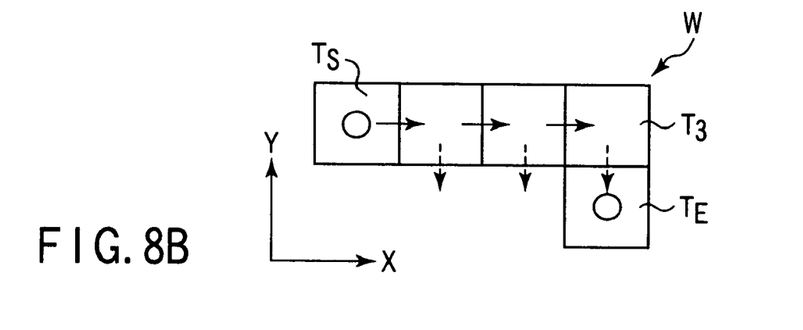

In the bottom-side retrieval shown in FIG. 8B, there is a chip under the third edge chip $T_3$, counted from the start chip $T_S$ with respect to the Y-direction. The retrieval is therefore switched to X-direction end retrieval. Thus, the left-hand retrieval is carried out.

When the bottom-side retrieval shown in FIG. 8A is finished, the main chuck 18 is moved stepwise, downward in the Y-direction. The right-hand retrieval is then started to retrieve the edge chips on the right-hand end with respect to the X-direction inward (upward) in the Y-direction. The right-hand retrieval will be described with reference to FIGS. 9A and 9B.

Figure 9A:
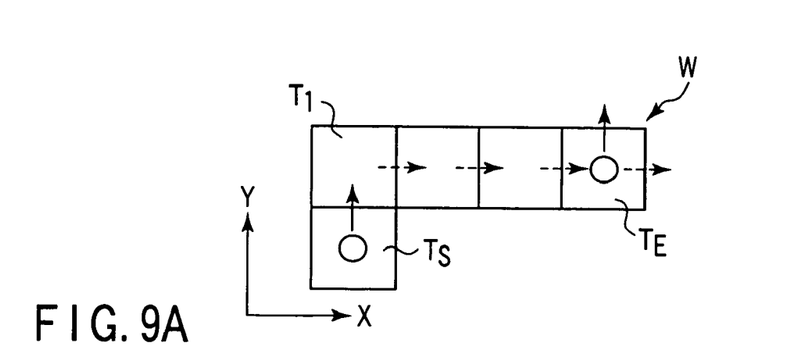
FIGS. 9A and 9B are diagrams that explains how right-hand retrieval is performed on the wafer by using the probe-area setting method of the invention.

In the right-hand retrieval shown in FIG. 9A, the retrieval position is moved upward from a start chip $T_S$ in the Y-direction, stepwise for one-chip distance as indicated by full-line arrow. The first chip $T_1$ is thereby detected. Whether or not the chip $T_1$ has the same pattern as the reference element pattern is determined. If the element pattern has the same pattern, it is determined that there is a chip.

Then, the retrieval position is moved stepwise to the right in the X-direction from the chip $T_1$ as indicated by broken-line arrow, to find chips, one after another, within the retrieval limit. The retrieval position is so moved until the retrieval limit is reached. In the case shown in FIG. 9A, no chips are found as the retrieval position is moved from the fourth chip, stepwise to the right in the X-direction. Hence, it is determined that that there are no chips. The retrieval position is therefore returned to the fourth chip. The fourth chip is identified as edge chip $T_E$.

The retrieval position is then moved upward again, stepwise in the Y-direction, retrieving the edge chips on the right-hand one after another. Any chip may be found when the retrieval limit is reached as the retrieval position is moved to the right in the X-direction. In this case, the retrieval position is moved inward in the Y-direction, and the retrieval is switched to the X-direction end retrieval. The retrieval position is further moved stepwise to the right in the X-direction. The edge chips are thereby retrieved.

Figure 9B:
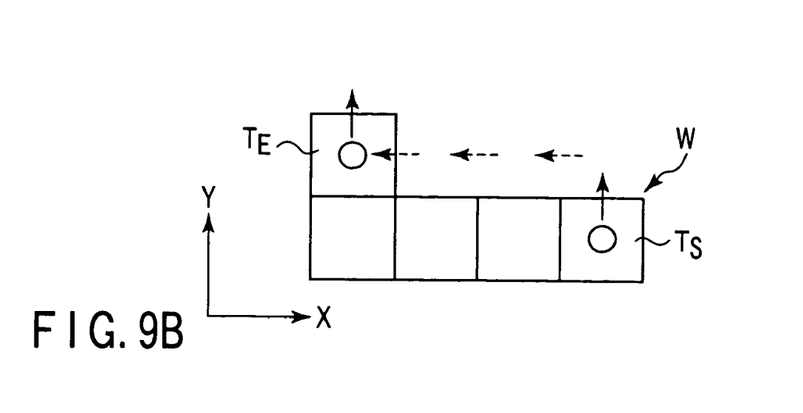

In the right-hand retrieval shown in FIG. 9B, it is determined that there are no chips, when the retrieval position is moved upward in the Y-direction from a start chip $T_S$ for one-chip distance as indicated by full-line arrow. In this case, the retrieval direction is changed to the inward X-direction. Then, the retrieval position is moved stepwise to find chips. This movement is continued until the retrieval limit is reached. Any chip, if found within the retrieval limit, is identified as edge chip $T_E$. If so, the retrieval position is moved upward in the Y-direction stepwise, or chip by chip. Thus, the right-hand retrieval continues. If no chips are found when the retrieval limit is reached, the retrieval is switched to Y-direction end retrieval. In the case shown in FIG. 9B, the right-hand retrieval is switched to the top-side retrieval.

The edge chips on the entire circumferential edge of the wafer W can be retrieved by performing the top-side retrieval, left-hand retrieval, bottom-side retrieval, and top-side retrieval as described above. The probe area is automatically recognized when the probe area is set after the edge chips around the wafer W have been retrieved.

In the first embodiment described above, the upper camera 21A photographs the reference element pattern. Further, the X-direction end retrieval and the Y-direction end retrieval can be carried out. The X-direction end retrieval is accomplished by comparing the element patterns of the edge chips formed at the opposite ends in the X-direction, with the reference element pattern. The Y-direction end retrieval is effected by comparing the element patterns of the edge chips formed at the opposite ends in the Y-direction, with the element pattern.

Further, the retrieval position is moved in the rotational direction of the wafer W to retrieve the edge chips. Even if the wafer W is one having an indefinite shape (FIG. 4B) or a broken one (FIG. 5), the edge chips can be reliably retrieved and inappropriate chips, if any, would not be retrieved. This renders it easy to set the probe area with high efficiency.

The left- and right-hand retrieval can reliably retrieve all edge chips formed on the opposite ends in the X-direction, making it possible to set the probe area. This is because the retrieval limit in the X-direction is set, and the retrieval direction is changed when the retrieval limit is reached.

Figure 10:
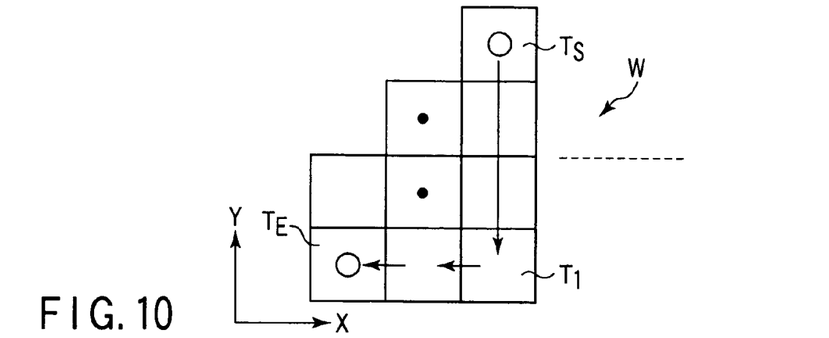
FIG. 10 is a diagram that explains how the left-hand retrieval is performed by using another probe-area setting method according to the present invention.
Figure 11:
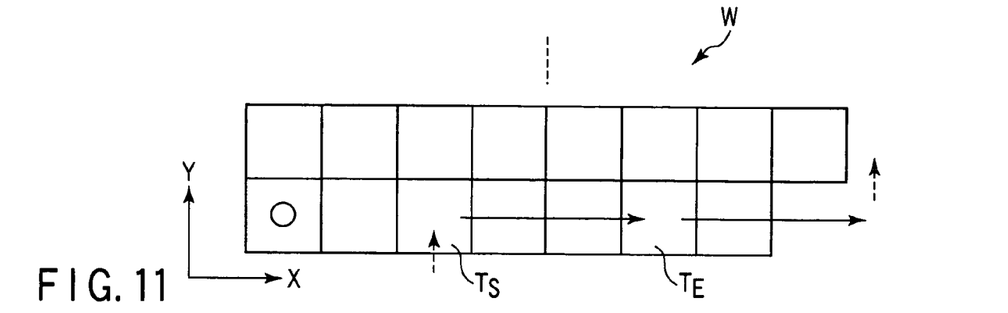
FIG. 11 is a diagram that explains how the bottom-side retrieval is performed by using still another probe-area setting method according to the invention.
Figure 12:
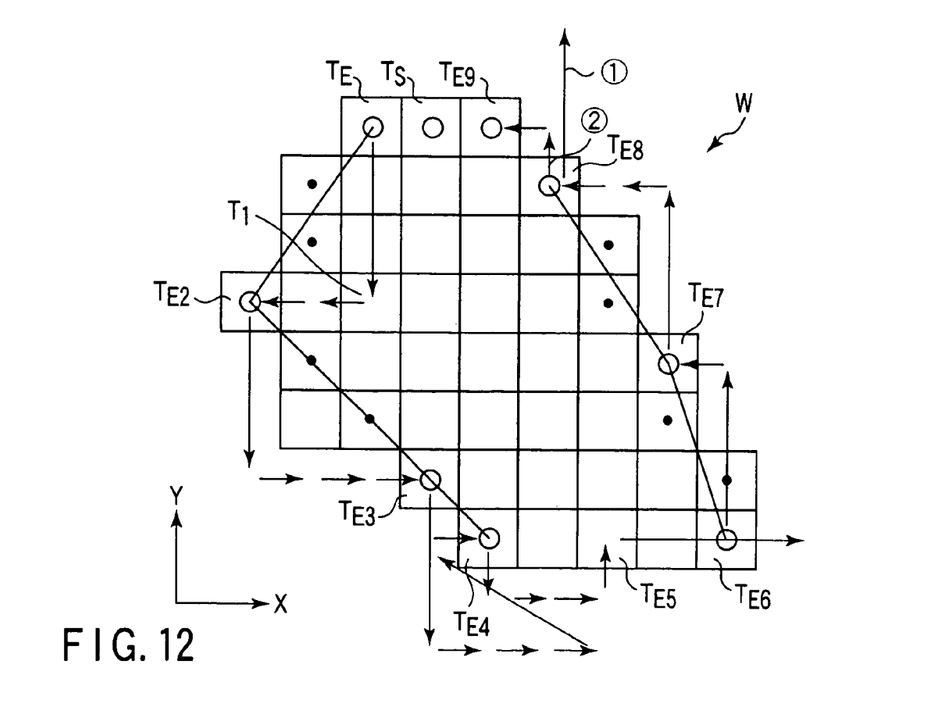
FIG. 12 is a diagram that explains how the edge chips formed at the entire circumference of the wafer are retrieved by using the probe-area setting method illustrated in FIGS. 10 and 11.

FIGS. 10 to 12 illustrate a method of setting the probe area in the second embodiment of the invention. In the second embodiment, the step size can be set to "3", for example. If the step size is "3", the retrieval position is moved stepwise by three-chip distance in top-side retrieval, left-hand retrieval, bottom-side retrieval, and right-hand retrieval. The probe area is set when all edge chips are identified.

In the second embodiment shown in FIG. 10, the left-hand retrieval performed by moving the retrieval position downward in the Y-direction from a start chip $T_S$, stepwise for three-chip distance, thereby detecting the first chip $T_1$. It is determined whether or not the element pattern of the chip $T_1$ is identical to the reference element pattern stored in the second storage unit. If the element pattern is identical, it is determined that there is a chip. Then, the retrieval position is moved from the chip $T_1$ stepwise to the left in the X-direction, by one-chip distance at each time, as in the left-hand retrieval of FIGS. 7A and 7B. This movement is continued until there remain no chips to retrieve. If there are no chips in the moved retrieval position, the retrieval position is returned to the last chip. This chip is identified as edge chip $T_E$. Then, the retrieval position is moved again downward in the Y-direction and stepwise by three-chip distance. The edge chips on the left-hand end are thereby identified one after another, as this operation is repeated. In the right-hand retrieval, the retrieval position is moved upward in the Y-direction, stepwise for three-chip distance as in the left-hand retrieval described above. The chips indicated by black spots in FIG. 10 are edge chips that are identified by the method mentioned later.

In the bottom-side retrieval of the second embodiment shown in FIG. 11, a start chip $T_S$ is reached after the left-hand retrieval, as indicated by broken line arrow in FIG. 11. The bottom-side retrieval is started with the start chip $T_S$. The first chip $T_1$ is retrieved after the retrieval position is moved stepwise in the X-direction or to the right in this case for a distance corresponding to three chips. If it is determined that there is a chip, this first chip is identified edge chip $T_E$. Then, the retrieval position is moved from the edge chip $T_E$ to the right in the X-direction, stepwise for three-chip distance as indicated by a full-line arrow, to retrieve chips. It is then determined that there are no chips. Therefore, the retrieval position is moved inward in the Y-direction. Thereupon, the bottom-side retrieval is switched to the right-hand retrieval.

How the chips at the entire circumference of the wafer W are retrieved counterclockwise with the step size "3" will be described with reference to FIG. 12. First, the start chip $T_S$ (i.e., center chip on the upper end with respect to the Y-direction in FIG. 12) is manually selected in accordance with the coordinate position of the start chip. The image photographed by the upper camera 21A is processed, thereby determining whether any chip exists at the coordinate position. If the start chip $T_S$ exists, the automatic setting of the probe area, which is based on programs, is started. The retrieval position is moved from that position to the left in the X-direction, stepwise for one-chip distance, to retrieve chips. The retrieval position is so moved until there remain no chips to retrieve. In the case shown in FIG. 12, there is a chip in a position that is reached by stepwise movement from the start chip $T_S$ for one-chip distance. Hence, this chip is identified as edge chip $T_E$. It is then determined whether any chip lie to the left of the edge chip $T_E$ with respect to the X-direction. If it is determined no chips lie to the left of the edge chip $T_E$, the top-side retrieval is switched over to the left-hand retrieval on the edge chip $T_E$.

In the left-hand retrieval, the retrieval position is moved downward in the Y-direction in a stepwise manner for a distance corresponding to three chips, as in the case shown in FIG. 10. The first chip $T_1$ is thereby detected. It is determined whether the chip $T_1$ has an element pattern identical to the reference element pattern stored in the second storage unit. If the chip $T_1$ has an identical element pattern, it is determined that that there is a chip. Then, the retrieval position is moved from the chip $T_1$ to the left in the X-direction, stepwise by one-chip distance at each time. The chips are thereby retrieved one after another. If there are no chips in the moved retrieval position, the retrieval position is returned to the last chip. The last chip is identified as edge chip ($T_{E2}$ in this case).

Between the edge chip ($T_{E2}$) thus identified and the last edge chip ($T_E$) identified earlier, there are unidentified edge chips (i.e., two left-hand chips marked with black spots in FIG. 12). The unidentified edge chips lie on a straight line connecting the edge chips $T_E$ and $T_{E2}$ already identified. They are therefore identified as edge chips. Thus, in the method of retrieval, wherein the step size is set to 1 or more, edge chips lying on a straight line connecting two edge chips identified respectively before and after the set retrieval position is moved with the set step size can be identified as edge chips, too. This method renders the retrieval time shorter than in the case where the chips are retrieved one after another and makes it easy to set probe area.

Next, the retrieval position is moved downward in the Y-direction, from the edge chip $T_{E2}$ for three-chip distance. Thus, the left-hand retrieval is carried out. If it is determined that there are no chips, the retrieval direction is changed to the rightward X-direction. The retrieval position is moved stepwise, by one-chip distance at each time, within the retrieval limit. If it is determined that there is a chip within the retrieval limit, this chip is determined as an edge chip ($T_{E3}$). The left-hand retrieval is continued from the edge chip $T_{E3}$. The retrieval position is moved downward again in the Y-direction, for three-chip distance. If it is determined that there are no chips, as shown in FIG. 12, the retrieval direction is changed to the rightward X-direction. Then, the retrieval position is moved stepwise, for one-chip distance at each time, within the retrieval limit, to retrieve chips.

In the retrieval in this direction it may be determined that there are no chips within the retrieval limit. If so, the retrieval position is returned to the chip next to or under the edge chip $T_{E3}$ last identified. Then, the retrieval position is moved again to the right in the X-direction from the next chip to retrieve chips. If it is determined that there is a chip, this chip is identified as edge chip $T_{E4}$. The retrieval position is moved downward in the Y-direction from the edge chip $T_{E4}$ for one-chip distance. If it is determined that there are no chips, the retrieval direction is changed from the downward Y-direction to the rightward X-direction. Thereupon, the retrieval position is moved to the right in the X-direction to retrieve chips. If it is determined that there are no chips within the retrieval limit, the retrieval position is moved upward in the Y-direction from that position, for one-chip distance to retrieve chips. In the case shown in FIG. 12, it is determined that there is a chip, and this chip is identified as edge chip $T_{E5}$. Then, the Y-direction end (bottom-side) retrieval is performed, starting with the chip $T_{E5}$. The retrieval position is moved stepwise to the right in the X-direction, for three-chip distance.

If not chips exist at the position to which the retrieval position has been moved, the retrieval position is returned from this position, stepwise for one-chip distance at each time, to retrieve the next edge chip. When it is determined that there is a chip, this chip is identified as edge chip $T_{E6}$. Thereafter, the bottom-side retrieval is switched to the right-hand retrieval, which starts with the edge chip $T_{E6}$ as a start chip.

In the right-hand retrieval shown in FIG. 12, the retrieval position is moved inward (upward) in the Y-direction for three-chip distance. The edge chips on the right-hand end are thereby retrieved. If there are no chips at the position to which the retrieval position has been moved, the retrieval direction is changed from the upward Y-direction to the leftward X-direction. Thus, the retrieval position is moved stepwise, for one-chip distance at each time. If it is determined that there is a chip at the destination, this chip is identified as edge chip $T_{E7}$. Thereafter, the retrieval position is moved upward again in the Y-direction, stepwise for three-chip distance at each time, to retrieve chips.

The retrieval position may be moved upward in the Y-direction for three-chip distance as indicated by arrow ① in FIG. 12, after an edge chip $T_{E8}$ is subjected to right-hand retrieval. If so, the position inevitably passes over a row of chips including the start chip. In this case, the retrieval position is moved in the Y-direction for one-chip distance as indicated by arrow ②in FIG. 12. The retrieval can be terminated when final edge chip $T_{E9}$ is found by right-hand retrieval, in the row including start chip $T_S$. If there is a chip line above the start chip $T_S$ and the final edge chip $T_{E9}$ with respect to the Y-direction, the chip line is not retrieved, thus saving the retrieval time. If the start chip is retrieved automatically, the retrieval can be terminated when the retrieval position is returned to the start chip $T_S$.

In the second embodiment described above, the upper camera 21A photographs the image of an element pattern, and the X-direction end retrieval and the Y-direction end retrieval are carried out. In the X-direction end retrieval, the element patterns of the respective edge chips located at the opposite ends in the X-direction are compared with the reference element pattern, as the retrieval position is moved stepwise in the Y-direction, by three-chip distance at each time, to retrieve the edge chips at the opposite ends. In the Y-direction end retrieval, the element patterns of the respective edge chips located at the opposite ends in the Y-direction are compared with the reference element pattern, as the retrieval position is moved stepwise in the X-direction, by three-chip distance at each time, to retrieve the edge chips at the opposite ends. Since the edge chips are retrieved one after another in the circumferential direction of the wafer W, the same advantage is achieved as in the first embodiment. In addition, the time for setting the probe area can be shortened.

In the second embodiment, the retrieval position may be moved stepwise, each time for the same distance, in both in the X-direction and the Y-direction. In the case shown in FIG. 12, for example, the position is moved stepwise from $T_E$ to $T_1$ in the Y-direction and outward in the X-direction from $T_1$ by the same distance. If there are no chips, the retrieval position may be returned step by step in the opposite direction to identify edge chips. The position is moved in the same manner in all directions that are shown in FIG. 12.

This invention is not limited to the embodiments described above. The probe area can be set in various manners, without departing from the scope or spirit of the invention. For example, the wafer W may be retrieved clockwise. The retrieval of chips may be started at any end portion of the wafer W, though it is started at the upper end in the embodiments described above.

The embodiments of the invention can provide a probe apparatus and a probing method, in which a camera photographs an image of the element pattern of a chip and edge chips are sequentially retrieved. Thus, the probe area can be set automatically.

With the embodiments of the invention it is possible to move the retrieval position in the X-direction or the Y-direction in accordance with some conditions, to retrieve edge chips one after another, in the circumferential direction of the wafer. Hence, the probe area can be set efficiently within a short time.

The embodiments of the invention can provide a probe-area setting method and a probe apparatus, which can automatically retrieve edge chips even if the chips are formed on a wafer which is broken and has an indefinite shape or which has small chips formed on it.

In the embodiments of the invention, all edge chips on a wafer are identified one after another in the circumferential direction of the wafer, first the chip adjoining the edge chip that has been identified as an edge chip. Hence, it suffices to move the retrieval position for the shortest distance required. The probe area can therefore be set efficiently.

In the embodiments of the invention, the retrieval position is moved outward in a given direction from the center of the wafer, thereby to retrieve chips. A chip identified as an edge in that direction is used as starting point for the retrieval that is to be performed next. Thus, the probe area can be set fully automatically.

In the embodiments of the invention, a limit is imposed on the distance for which the retrieval position can be moved in the X-direction to retrieve chips formed on the outer periphery. When the movement of the position exceeds the limit, the direction of moving the position is changed from the X-direction to the Y-direction. Thus, the retrieval direction can be modified to retrieve chips, one after another in the circumferential direction of the wafer W. Useless retrieval can be prevented, which shorten the time for setting the probe area.

In the embodiments of the invention, objects to inspect, which lie on a line connecting two adjacent outer peripheral objects retrieved in succession, are identified as outer peripheral objects. Thus, the retrieval time can be shorter than in the case where the chips are retrieved one, one by one. This makes it easy to set the probe area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method of setting a probe area on a wafer-type substrate placed on a stage in a probe apparatus which has the stage and an image-pickup apparatus for picking up an image of the surface of the stage, comprising:
   (a) placing the substrate on the stage;
   (b) selecting an object formed on the outermost periphery of the substrate, as an outer peripheral object to be inspected, and locating the object;
   (c) moving the stage and the image-pickup apparatus in an X- or Y-direction, thereby retrieving and locating outer peripheral objects formed on the outer periphery of the substrate adjacent to the outer peripheral object, while changing the retrieving direction of the image-pickup apparatus to the X- and Y-direction; and
   (d) determining a probe area from the positions of the outer peripheral objects located in the step (c),
   wherein said moving step (c) further comprises,
   successively retrieving the objects adjacent to the outer peripheral object located in (b) in the rotational direction of the substrate, starting with the outer peripheral object located, thereby identifying all outer peripheral objects provided on the substrate, the identifying of the outer peripheral objects including,
   (c1) performing X-direction end-retrieval to retrieve each object formed on the outer periphery, at the opposite ends in the X-direction, by moving the retrieval position in a first Y-direction from the outer peripheral object already identified, such that
   (c1-1) if any object to inspect exists in the first Y-direction, the retrieval position is moved outward further in the X-direction; if any object exists in the position to which the retrieval position has been moved, the retrieval position is moved until no objects exist at the new retrieval position; if no objects exists at the new retrieval position, the retrieval position is moved back to the immediately preceding object; and the object at this position is identified as an outer peripheral object and the retrieval position is then moved again in the first Y-direction; and (c1-2) if no object exists in the first Y-direction, the retrieval position is moved inward in the X-direction; if an object exists in the position to which the retrieval position has been moved, the object is identified as an outer peripheral object, and the retrieval position is then moved again in the first Y-direction; and if no object exists in the position to which the retrieval position has been moved, the Y-direction ends are retrieved; and (c2) performing Y-direction end retrieval to retrieve each object formed on the outer periphery, at the opposite ends in the Y-direction, by moving the retrieval position in a first X-direction from the outer peripheral object already identified as objects, to retrieve other objects to inspect, such that:

(c2-1) if any object exists in the first X-direction, the retrieval position is further moved outward in the Y-direction; if no objects exist in the position to which the retrieval position has been moved, the retrieval position is moved back to the immediately preceding object, the immediately preceding object is identified as an outer peripheral object, and the retrieval position is then moved again in the first X-direction; and (c2-2) if no objects exist in the first X-direction, the retrieval position is moved inward in the Y-direction, and the X-direction ends are retrieved.

2. The method of setting a probe area, according to claim 1, wherein (b) is performed by moving the stage in the X- and Y-directions.

3. A method of setting a probe area, on a wafer-type substrate placed on a stage in a probe apparatus which has the stage and an image-pickup apparatus for picking up an image of the surface of the stage, comprising:

(a) placing the substrate on the stage;

(b) selecting an object formed on the outermost periphery of the substrate, as an outer peripheral object to be inspected, and locating the object;

(c) moving the stage and the image-pickup apparatus in an X- or Y-direction, thereby retrieving and locating outer peripheral objects formed on the outer periphery of the substrate adjacent to the outer peripheral object, while changing the retrieving direction of the image-pickup apparatus to the X-and Y-direction; and (d) determining a probe area from the positions of the outer peripheral objects located in the step (c), wherein said moving step (c) further comprises, first retrieving the outer peripheral object located in (b) and then retrieving the objects adjacent to the outer peripheral object, one after another in the circumferential direction of the substrate, thereby identifying all the outer peripheral objects formed on the substrate, the identifying of the outer peripheral objects includes, (c3) carrying out X-direction end retrieval to retrieve the objects formed on the outer periphery, at the opposite ends in the X-direction, by moving the retrieval position in a first Y-direction from the outer peripheral object already located, by a distance for a plurality of objects at a time, such that (c3-1) if any object to inspect exists in the first Y-direction, the retrieval position is repeatedly moved outward in the X-direction, each time by a distance for one object; if any object exists in the position to which the retrieval position has been moved, the retrieval position is moved outward in the X-direction until no objects exist at the new retrieval position; if no object exists in the position to which the retrieval position has been moved, the retrieval position is moved back to the immediately preceding object, the immediately preceding object is identified as an outer peripheral object, the retrieval position is then moved again in the first Y-direction; and (c3-2) if no objects to inspect exist in the first Y-direction, the retrieval position is repeatedly moved inward in the X-direction, each time by a distance for one object; if any object exists at any retrieval position in the X-direction, the object is identified as an outer peripheral object, and the retrieval position is moved again in the first Y-direction; if no objects exist at any retrieval position in the X-direction, the retrieval position is moved back to the object next to the immediately preceding outer peripheral object, and the retrieval position is then repeatedly moved inward in the X-direction, each time by a distance for one object; and (c4) performing Y-direction end retrieval to retrieve the objects formed on the outer periphery, at the opposite ends in the Y-direction, by moving the retrieval position in a first X-direction from the outer peripheral object already identified, by a distance for a plurality of objects at a time, such that (c4-1) if any object exists in the first X-direction, the retrieval position is repeatedly moved outward in the Y-direction, each time by a distance for one object; if any object exists in the position to which the retrieval position has been moved, the ends in the X-direction ends are retrieved: if no objects exist in the position to which the retrieval position has been moved, the retrieval position is moved back to the immediately preceding object, the immediately preceding object is identified as an outer peripheral object, and then the retrieval position is moved again in the first X-direction; and (c4-2) if no objects exists in the first X-direction, the retrieval position is repeatedly moved inward in the Y-direction, each time a distance for one object, thereby retrieving the ends in the X-direction.

4. The method of setting a probe area, according to claim 1, wherein (c) comprises retrieving first the outer peripheral object in the step (b) and then retrieving the objects adjacent to this outer peripheral object, one after another, in the circumferential direction of the substrate, thereby to identify all outer peripheral objects formed on the substrate.

5. The method of setting a probe area, according to claim 1, wherein the wafer-type substrate, on which the probe area is set, is a broken substrate, a substrate of an indefinite shape, or a substrate having small objects, on which outer peripheral objects can hardly be located in advance.

6. The method of setting a probe area, according to claim 1, wherein a limit is set in (c) to the distance for which the retrieval position is moved in the X-direction to locate a plurality of objects formed on the outer periphery.

7. The method of setting a probe area, according to claim 6, wherein the direction of moving the retrieval position over the substrate is changed from the X-direction to the Y-direction when the limit is reached or exceeded.

8. The method of setting a probe area, according to claim 3, wherein objects lying on a line connecting two adjacent outer peripheral objects located in succession are identified as outer peripheral objects to inspect.

9. The method of setting a probe area, according to claim 1, wherein objects having element patterns different from that of the aforesaid object are not subjected to retrieval.

* * * * *